(12) United States Patent
Raba et al.

(10) Patent No.: US 12,313,978 B2
(45) Date of Patent: May 27, 2025

(54) OPTICAL ASSEMBLY, PROJECTION EXPOSURE APPARATUS AND METHOD

(71) Applicant: Carl Zeiss SMT GmbH, Oberkochen (DE)

(72) Inventors: Andreas Raba, Niederschoenenfeld (DE); Johannes Lippert, Buch am Wald (DE); Markus Raab, Schillingsfuerst (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 252 days.

(21) Appl. No.: 17/818,904

(22) Filed: Aug. 10, 2022

(65) Prior Publication Data

US 2022/0382165 A1 Dec. 1, 2022

Related U.S. Application Data

(63) Continuation of application No. PCT/EP2021/053278, filed on Feb. 11, 2021.

(30) Foreign Application Priority Data

Feb. 13, 2020 (DE) .......................... 102020201774.3

(51) Int. Cl.
*G03F 7/20* (2006.01)
*G02B 7/18* (2021.01)
(Continued)

(52) U.S. Cl.
CPC ......... *G03F 7/70266* (2013.01); *G02B 7/181* (2013.01); *G02B 7/182* (2013.01);
(Continued)

(58) Field of Classification Search
CPC . G03F 7/70266; G03F 7/70891; G02B 7/181; G02B 7/182; G02B 26/0825;
(Continued)

(56) References Cited

U.S. PATENT DOCUMENTS

| 6,512,323 B2* | 1/2003 | Forck ................... H10N 30/057 |
| | | 310/330 |
| 2010/0033704 A1 | 2/2010 | Shiraishi |
| 2010/0208357 A1* | 8/2010 | Batchko ................... G02B 5/20 |
| | | 359/666 |

FOREIGN PATENT DOCUMENTS

| DE | 103 44 178 A1 | 4/2005 |
| DE | 10 2009 055 303 A1 | 7/2010 |

(Continued)

OTHER PUBLICATIONS

Translation of International Search Report for corresponding Appl. No. PCT/EP2021/053278, dated Aug. 31, 2021.
(Continued)

*Primary Examiner* — Mesfin T Asfaw
(74) *Attorney, Agent, or Firm* — Fish & Richardson P.C.

(57) ABSTRACT

An optical assembly of a projection exposure apparatus for semiconductor lithography comprises an optical element and an actuator for deforming the optical element. The actuator is subjected to a bias voltage by a controller that is present. A projection exposure apparatus for semiconductor lithography comprises an optical assembly. A method for operating an actuator for deforming an optical element for semiconductor lithography comprises subjecting the actuator to a bias voltage by a controller.

23 Claims, 7 Drawing Sheets

(51) Int. Cl.
  *G02B 7/182*   (2021.01)
  *G02B 26/08*   (2006.01)
  *G03F 7/00*    (2006.01)
  *H10N 30/20*   (2023.01)
  *H10N 30/50*   (2023.01)
  *H10N 30/88*   (2023.01)

(52) U.S. Cl.
  CPC ....... *G02B 26/0825* (2013.01); *H10N 30/206* (2023.02); *H10N 30/50* (2023.02); *H10N 30/88* (2023.02)

(58) Field of Classification Search
  CPC ........ G02B 5/0891; G02B 5/09; G02B 7/185; H10N 30/206; H10N 30/50; H10N 30/88; H10N 30/80; H10N 30/852
  See application file for complete search history.

(56) References Cited

FOREIGN PATENT DOCUMENTS

| | | |
|---|---|---|
| DE | 10 2012 212 953 A1 | 6/2013 |
| DE | 10 2014 219 755 A1 | 4/2015 |
| DE | 10 2015 221 921 A1 | 10/2016 |
| DE | 10 2016 201 445 A1 | 2/2017 |
| DE | 10 2017 205 405 A1 | 10/2018 |
| DE | 10 2018 212 508 A1 | 1/2020 |

OTHER PUBLICATIONS

German Office Action, with translation thereto, for corresponding German Appl No. 10 2020 201 774.3, dated Oct. 1, 2020.

* cited by examiner

OPTICAL ASSEMBLY, PROJECTION EXPOSURE APPARATUS AND METHOD

CROSS-REFERENCE TO RELATED APPLICATIONS

The present application is a continuation of, and claims benefit under 35 USC 120 to, international application PCT/EP2021/053278, filed Feb. 11, 2021, which claims benefit under 35 USC 119 of German Application No. 10 2020 201 774.3 filed on Feb. 13, 2020. The entire disclosure of each of these applications is incorporated by reference herein.

FIELD

The disclosure relates to an optical assembly, such as an optical assembly for a projection exposure apparatus for semiconductor lithography, and to a projection exposure apparatus equipped with a corresponding assembly. Furthermore, the disclosure relates to a method for operating an actuator for deforming an optical element of a projection exposure apparatus for semiconductor lithography.

BACKGROUND

Projection exposure apparatuses are used for producing extremely fine structures, for example on semiconductor components or other microstructured component parts. The operating principle of the apparatuses is based on the production of very fine structures down to the nanometer range by way of generally reducing imaging of structures on a mask, using what is known as a reticle, on an element to be structured, known as a wafer, that is provided with photosensitive material. The minimum dimensions of the structures produced are, in general, directly dependent on the wavelength of the light used. Recently, light sources having an emission wavelength in the range of a few nanometers, for example between 1 nm and 120 nm, for example in the region of 13.5 nm, have increasingly been used. The described wavelength range is also referred to as the EUV range.

Apart from EUV systems, the microstructured component parts are also produced using commercially established DUV systems, which have a wavelength of between 100 nm and 400 nm, for example 193 nm. As a result of the introduction of the EUV range, and hence the possibility of being able to produce even smaller structures, there has also been a further increase in the demands with respect to the optical correction of the DUV systems with a wavelength of 193 nm. Additionally, there is, in general, an increase in the throughput of each new generation of projection exposure apparatuses, independently of the wavelength, so as to increase the profitability; this typically leads to a greater thermal load and hence to more imaging aberrations caused by the heat. To try to correct the imaging aberrations, use can be made, inter alia, of manipulators which alter the position and alignment of the optical elements or influence the imaging properties of the optical elements, for example mirrors, by deforming the optically active surfaces. A drawback of certain known approaches for deformable mirrors can be that a change in geometry, brought about by a change in temperature, of the actuators used can lie in the region of the travels for correcting the imaging, with the result that the travel for correcting the imaging may no be longer sufficient.

SUMMARY

The present disclosure seeks to provide an improved optical assembly, an improved projection exposure apparatus and an improved method.

An optical assembly a projection exposure apparatus for semiconductor lithography comprises an optical element and an actuator for deforming the optical element. Here, according to the disclosure, a controller is present, which subjects the actuator, in a zero position, to a bias voltage in order to create a deflection of the actuator.

The bias voltage should be understood here as meaning that it establishes a bias of the actuator such that, as a result of a variation in the applied voltage around the zero position, a deflection of the actuator in respectively opposite directions can be achieved. In other words, it is possible for the actuator to expand or contract around the zero position in the event of a variation in the voltage without a change in polarity.

Here, the bias voltage may be determined such that the change in shape, brought about by a change in temperature, of the actuator and the reduction in sensitivity, brought about by a change in temperature, of the change in shape, caused by a voltage, of the actuator can compensate one another. Given a suitable choice of the materials used and of the bias voltage, it is possible in this way to establish a state in which the actuator exhibits a high level of robustness with respect to thermal drift.

Furthermore, the optical assembly may comprise a compensation element for compensating a change in geometry, brought about by a change in temperature, of the actuator. The compensation element can also be used when the actuator is operated without bias voltage.

In this case, the compensation element may have a different thermal expansion than the actuator. In this connection, thermal expansion should be understood as meaning that the geometry of an element as a whole changes in the event of a change in temperature, i.e. for example the length of the element increases or decreases. The thermal expansion of an element should thus be understood as being analogous to the coefficient of thermal expansion of a material.

Furthermore, the compensation element may have a thermal expansion with an opposite sign to the thermal expansion of the actuator.

For example, the compensation element may have a negative thermal expansion. Thus, given a positive change in temperature, the spatial expansion of the compensation element may decrease at least in one spatial direction, for example the length of the compensation element may decrease.

Furthermore, the actuator may comprise electrostrictive and/or piezoelectric and/or magnetostrictive elements. In general, other kinds of actuator are also conceivable, which are suitable for use in semiconductor technology, for example in projection exposure apparatuses for semiconductor technology.

In some embodiments, the compensation element may be arranged between the optical element and the actuator. The compensation element may be for example a plate made of a material with a negative coefficient of thermal expansion, which is arranged between the optical element, for example a mirror of a projection exposure apparatus, and the actuator, for example an electrostrictive drive. In general, actuators that have a negative coefficient of thermal expansion are also conceivable. In this case, the compensation element would, of course, generally have the opposite, i.e. a positive coefficient of thermal expansion.

In some embodiments, the actuator may comprise the compensation element. The compensation element may thus be integrated in the actuator.

In this case, the actuator may have a layered construction. As a result, an electrode may be introduced between each of the individual layers; this may result in amplification of the electric or magnetic field in the electrostrictive, piezoelectric or magnetostrictive material.

Furthermore, the compensation element may comprise a plurality of layers. This can allow for different materials to be combined in one compensation element and thus the thermal expansion can be set.

For example, the actuator may be constructed such that the layers made of electrostrictive material alternate with the layers made of material of the compensation element. As a result, the production process for the actuator can remain virtually unchanged. Besides the electrostrictive material, the layers of the actuator may also comprise piezoelectric and/or magnetostrictive material.

In this case, electrodes may be arranged between the individual layers.

In some embodiments, the electrodes may be arranged such that no electric field can form across the layers of the compensation element. This can mean that no electric or magnetic field acts on the material of the compensation element and thus a change in the geometry of the compensation element caused by the action of the electric or magnetic element can be avoided.

Furthermore, the actuator may be constructed such that the compensation element can be embedded in the form of a plurality of individual elements in the material of the actuator. The compensation element may for example be embedded in the form of spherical elements in the material of the actuator. These may be pre-sintered and then be combined with the powder of the actuator before the process of sintering the actuator.

In addition, the actuator and the compensation element may be formed together such that, in the event of a change in temperature, at least in the effective direction of the actuator, differences from a target value of less than 5 ppm/K, such as less than 1 ppm/K, for example less than 0.1 ppm/K, e.g., less than 0.01 ppm/K arise.

The target value may for example be 0 ppm/K, but also the CTE of a mirror body may also represent an advantageous value for the target value.

Thus, in the event of a change in temperature of the optical assembly, the optical element is not subjected to any or is subjected to only minimal deformation by the actuator and the compensation element. Advantageous values for the still permissible deformation of the optically effective surface lie in the region of less than one tenth, such as less than one hundredth, for example less than one thousandth of the wavelength used for imaging, i.e. substantially in the pm region.

Besides the thermal expansion of the actuator and of the compensation element, the stiffness of the actuator and of the compensation element are also included in the configuration of the assembly according to the disclosure. Likewise, an adhesive used for attaching the compensation element or the actuator to the optical element may also be taken into consideration in the configuration.

Furthermore, the actuator and the compensation element may be formed together such that, in the event of a change in temperature, a change in geometry corresponding to the change in geometry of a component part connected to the actuator and/or to the compensation element can arise. If for example the optical element expands by 0.1 mm/K, the actuator and the compensation element are designed such that they likewise expand by 0.1 mm/K at the connection point to the optical element.

Furthermore, the actuator and the compensation element may be formed together such that, in the event of a change in temperature, they can compensate a change in geometry of a component part connected to the actuator and/or to the compensation element. In this case, the actuator, the compensation element and for example the optical element can be considered to be one unit. The thermal expansion, or coefficient of thermal expansion, and the stiffnesses of the unit as a whole can thus be configured such that, in the event of an increase in temperature, the change in geometry of the optical element may be less than without the actuator and the compensation element. For example, the change in geometry of the optical element may be virtually zero.

In some embodiments, the actuator may be designed such that a deformation of the optical element is brought about by a transverse deformation of the actuator. The electrostrictive or piezoelectric or magnetostrictive actuator thus does not use the effect of the change in length upon application of an electric or magnetic field, but rather the cross-sectional change acting perpendicularly to the linear expansion, known as the transverse deformation. To this end, the actuator may be connected to an optical element by one of the sides arranged in the effective direction of the change in length, wherein the opposite side remains free, i.e. without a fixed attachment to a component part. If a field is now applied to the actuator, a change in length occurs, which, on account of the free end, has no effect on the optical element in the form for example of a mirror. Rather, as a result of the transverse deformation brought about by the change in length, the mirror material contracts or is pushed apart and as a result brings about a deformation of the mirror.

Furthermore, the optical assembly may comprise a plurality of individual actuators. These may be arranged in the form of a matrix on the rear side of an optical element in the form for example of a mirror of a projection exposure apparatus. As a result of the individual control of the actuators with open-loop and/or closed-loop control, the opposite surface of the mirror from the rear side can be deformed in several degrees of freedom.

A projection exposure apparatus according to the disclosure for semiconductor technology can comprise an optical assembly according to one of the exemplary embodiments described above.

In some embodiments, a method according to the disclosure for operating an actuator for deforming an optical element for semiconductor lithography, the actuator is subjected to a bias voltage by a controller that is present. In other words, for example in the case of an electrostrictive actuator, a particular expansion state or deformation state is set in one spatial direction. Starting from this expansion or deformation state, the actuator can then both be stretched and contract without the polarity of the voltage changing.

In this case, in certain embodiments, the bias voltage is chosen such that, when the bias voltage is applied, the actuator brings about a zero position of the associated optical element.

A zero position of the optical element should be understood as meaning that setting in which the optical element would be operated if no correction of an imaging error needed to be carried out, i.e. the optical element already has, in its original shape, the optimal surface shape for creating an image representation in a projection exposure apparatus for semiconductor lithography. As a result of a variation in the applied bias voltage around this zero position, both bulging and indentation of the surface associated with the particular actuator can be brought about.

In some embodiments, the bias voltage can be used when it is chosen such that the change in shape, brought about by a change in temperature, of the actuator and the reduction in sensitivity, brought about by a change in temperature, of the voltage-related change in shape of the actuator compensate one another.

Thus, it is possible for example for an electrostrictive actuator to act in a normal direction to a surface to be actuated. In other words, the actuator pushes or pulls the main body of an optical element, for example of a mirror, perpendicularly to the optically effective surface of the mirror. In electrostrictive actuators, the sensitivity of the actuating elements to changes in voltage decreases with increasing temperature, meaning that an actuator biased at a particular fixed voltage would reduce its linear expansion, without further effects, with increasing temperature.

This effect can be counteracted, however, in that the opposite effect of the thermal expansion of the actuator material when the actuator is heated is advantageously exploited. Given a suitable design of the actuator, a bias voltage can thus be set at which the actuator is largely insensitive to temperature fluctuations with regard to its expansion in a zero position of the optical element. In this case, an additional compensating material (for example with a negative CTE) for compensating the thermal expansion of an actuator is not necessary, but rather use can be made of the effect that the biased actuator material tends to shrink with increasing temperature on account of the weakening electrostrictive effect and this effect is compensated by the opposite linear thermal expansion of the material.

As already mentioned, this effect can be used for example in actuators which are used via their linear expansion and contraction in a normal direction to an optically effective length or to an optical element.

If a compensation element with a thermal expansion with an opposite sign to the thermal expansion of the actuator is present, for example if the compensation element has a negative thermal expansion, the described effect can also advantageously be used for actuators that act parallel to the optically effective surface of an optical element.

These actuators may for example likewise be electrostrictive actuators which are connected, by the side that contracts with increasing voltage, to the optical element to be actuated. In this case, given a fixed bias voltage and a simultaneous change in temperature, the electrostrictive effect would likewise decrease, and the actuator would contract in its effective direction, and this would in turn result in expansion of the face connected to the optical element. Since the compensation element has a negative thermal expansion, this effect is in turn counteracted however, such that, in this case too, a bias voltage is settable at which the effects would just mutually compensate one another and the actuator is likewise relatively insensitive to temperature fluctuations at the suitably chosen bias voltage.

In both cases outlined above, starting from the particular application of the actuator, precise adjustment of the desired bias voltage and the proportions of the materials used, for example including layer thicknesses of a compensation element, will typically be carried out.

BRIEF DESCRIPTION OF THE DRAWINGS

Exemplary embodiments and variants of the disclosure are explained in more detail below with reference to the drawing, in which.

DESCRIPTION OF EXEMPLARY EMBODIMENTS

Figure 1:
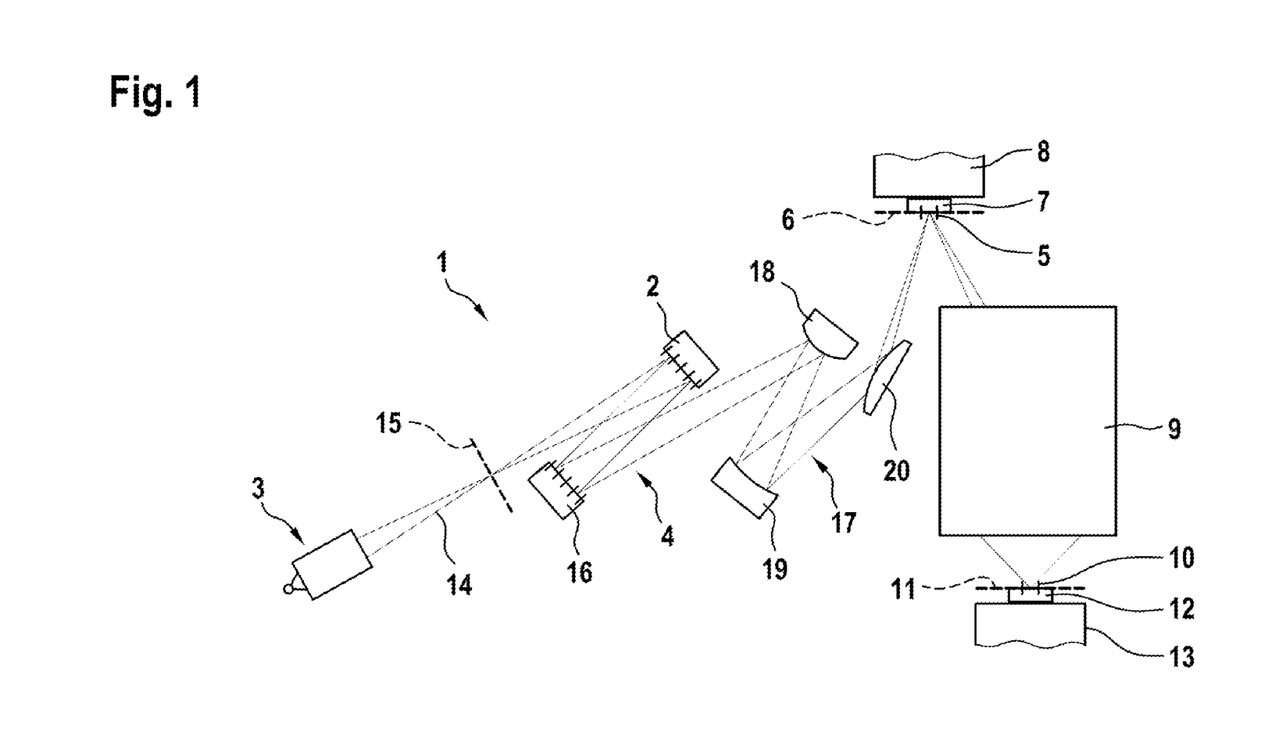
FIG. 1 shows a basic construction of a projection exposure apparatus.

FIG. 1 shows by way of example the basic construction of a microlithographic EUV projection exposure apparatus 1 in which the disclosure can find application. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A merely schematically illustrated projection optical unit 9 serves for imaging the object field 5 into an image field 10 in an image plane 11. A structure on the reticle 7 is imaged onto a light-sensitive layer of a wafer 12, which is arranged in the region of the image field 10 in the image plane 11 and held by a likewise partly represented wafer holder 13. The light source 3 can emit used radiation for example in a wavelength range of between 5 nm and 120 nm.

The disclosure can likewise be used in a DUV apparatus, which is not illustrated. A DUV apparatus is set up in general like the above-described EUV apparatus 1, wherein mirrors and lens elements can be used as optical elements in a DUV apparatus and the light source of a DUV apparatus emits used radiation in a wavelength range from 100 nm to 300 nm.

Figure 2:
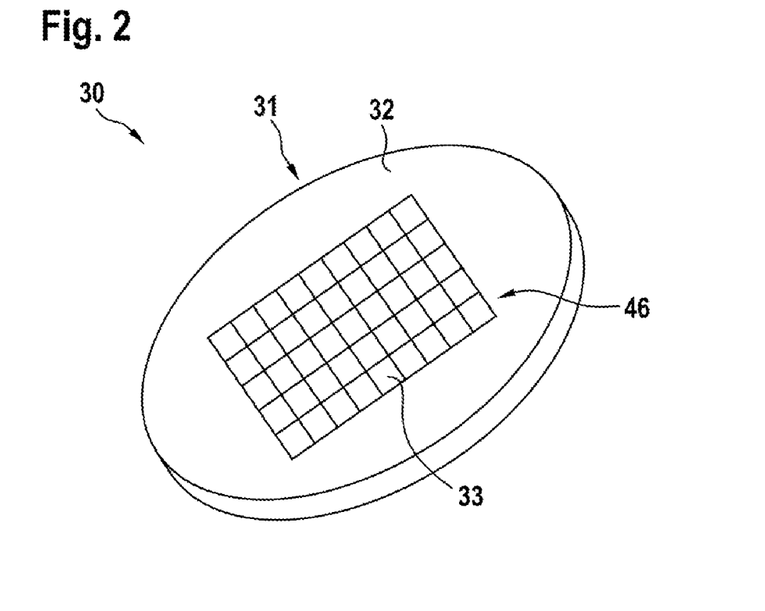
FIG. 2 shows a basic construction of an optical assembly.

FIG. 2 shows the basic construction of an optical assembly 30 in which a mirror 31 having an actuator matrix 46 is illustrated. The mirror 31 is for example part of the projection optical unit 9 described in FIG. 1. The actuator matrix 46 comprises a plurality actuators 33 arranged in the manner of matrix, which are arranged on the rear side 32 of the mirror, i.e. on the opposite side of the mirror 31 from the optically active side. As a result of the actuators 33 being deflected, the rear side 32 of the mirror is deformed, with the result that the optically active face of the mirror 31 is also deformed on account of the stiffness of the mirror 31. As a result of the deformation of the optically active mirror surface, the imaging properties of the mirror 31 are changed, with the result that imaging aberrations of the projection optical unit can be compensated. An optically active face is understood here to be a face which, during normal operation of the associated apparatus, is subjected to used radiation, i.e. radiation used for imaging and exposure.

Figure 3:
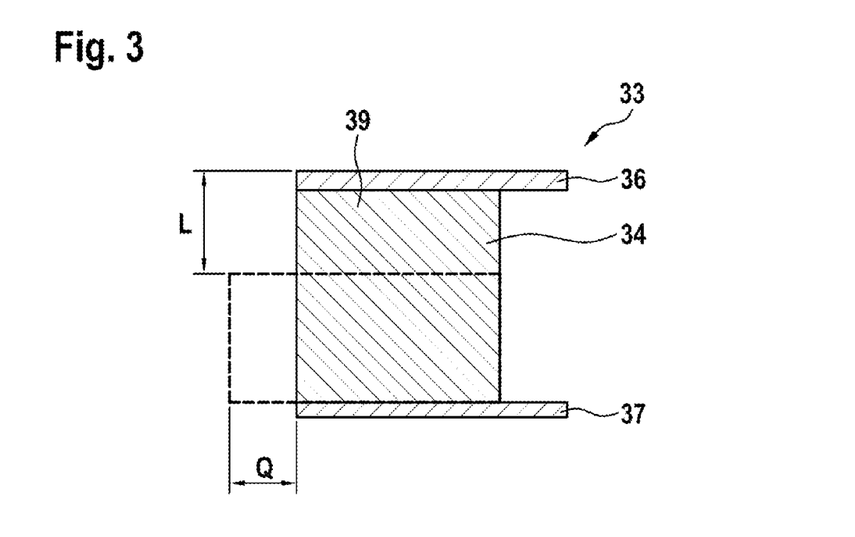
FIG. 3 shows a basic mode of action of an actuator.

FIG. 3 schematically shows the basic construction of an actuator 33 without the attachment to the rear side of the mirror. The electrostrictive actuator material 39 is arranged between two electrodes 36, 37 as an actuator layer 34, wherein the first electrode is in the form of a voltage electrode 36 and the second electrode is in the form of a neutral electrode 37 or neutral conductor. As a result of the application of a voltage between the voltage electrode 36 and neutral electrode 37, an electrostrictive effect is brought about, which causes a change in length L of the actuator material 39 in a first direction and a transverse contraction Q, i.e. a contraction of the material 39 in a second direction perpendicular to the first direction. In FIG. 3, the shape of the actuator 33 without the action of an electric field is illustrated by dashed lines. For the deformation of the mirror 31 illustrated in FIG. 2, for example the transverse contraction or transverse deformation Q of the actuator 33 can be used. In this case, the actuator 33 is operated such that the force exerted thereby is exerted substantially along the contact face between the mirror 31 and the actuator 33 and not normally thereto.

FIGS. 4A to 4D show different variants of a construction of an optical assembly 30 and of the actuator 33, in each of which an actuator 33 and a thermal compensation element are illustrated.

Figure 4A:
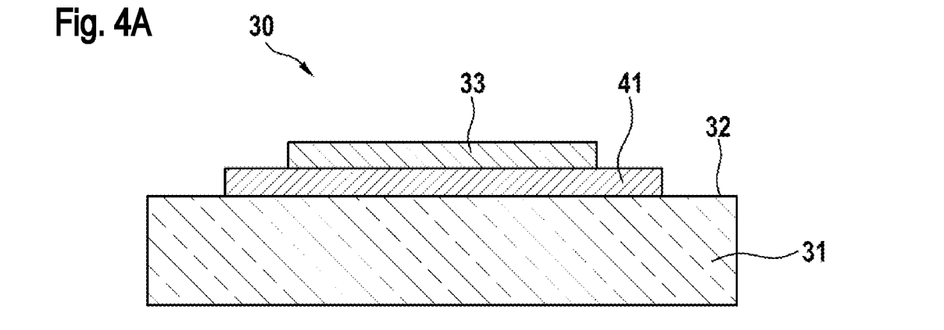
FIGS. 4A-4D show a schematic illustration of different variants of a structure of an actuator and of a compensation element.

FIG. 4A shows a first variant, in which an optical assembly 30 having an actuator 33 and a compensation plate 41 is illustrated. The compensation plate 41 is arranged between the actuator 33 and the rear side 32 of the mirror 31 and has a negative thermal expansion. If the mirror 31, the compensation plate 41 and the actuator 33 are subjected to an increase in temperature, the actuator 33 widens in the direction parallel to the rear side 32 of the mirror, whereas the negative thermal expansion of the compensation plate 41 in this case brings about a reduction in the width of the compensation plate 41. Given a suitable choice of the thermal expansion of the actuator 33 and of the compensation plate 41 and taking the stiffnesses of the actuator 33 and of the compensation plate 41 into consideration, the resultant movement between the compensation plate 41 and the rear side 32 of the mirror is equal to zero. This is only the case, however, when the mirror 31 itself does not exhibit any thermal expansion. The thermal expansion and the stiffnesses of the actuator 33 and of the compensation plate 41 are advantageously set such that they jointly have a thermal expansion corresponding to the thermal expansion of the mirror 31.

Figure 4B:
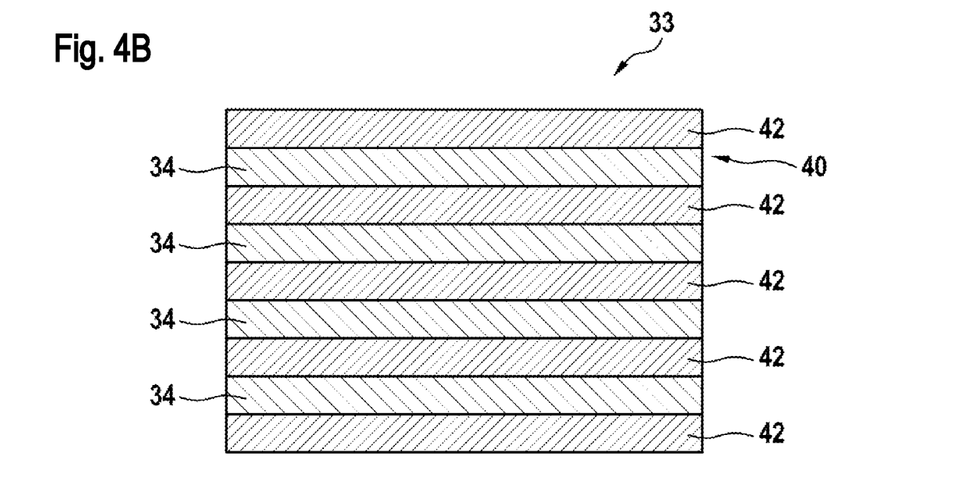

FIG. 4B shows a further variant of a construction of the actuator 33, in which an actuator 33 having integrated compensation elements 40 is illustrated. The actuator 33 and the compensation element 40 each comprise a plurality of layers 34, 42, which are layered alternately on one another. As already described with reference to FIG. 4A, the thermal expansion, or the coefficient of thermal expansion defined as the material constant, and the stiffnesses of the actuator layers 34 and of the compensation layers 42 are configured such that they correspond in total to the thermal expansion of the mirror. The actuator layer 34 may comprise an electrostrictive material, for example lead magnesium niobate, a piezoelectric material or a magnetostrictive material. The compensation layer 42 may comprise for example $Ba_{0.2}Sr_{0.8}Zn_2Si_2O_7$ or zirconium tungstate $Zr[WO_4]_2$.

Figure 4C:
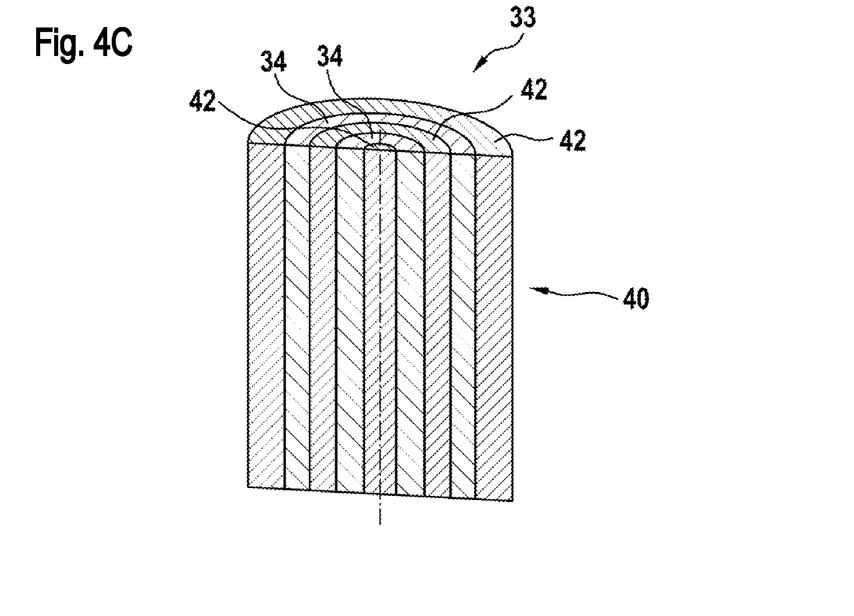
Figure 4D:
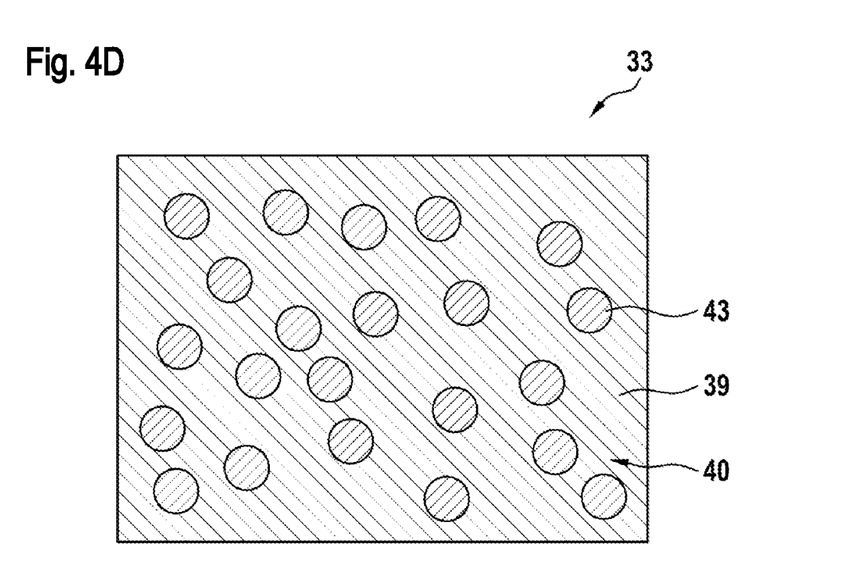

In the variant, shown in FIG. 4C, of a construction of an actuator 33 having an integrated compensation element 40, a radial layer construction of actuator layers 34 and compensation layers 42 is illustrated. The procedure for the configuration of the actuator is analogous to the procedure described with reference to FIGS. 4A and 4B. FIG. 4D shows a further variant of a construction of an actuator 33 having a compensation element 40, which is embedded in the form of compensation beads 43 in the electrostrictive material 39 of the actuator 33. Here too, the procedure for the configuration of the thermal expansion of the actuator 33 is analogous to the procedure in FIGS. 4A to 4C.

Figure 5:
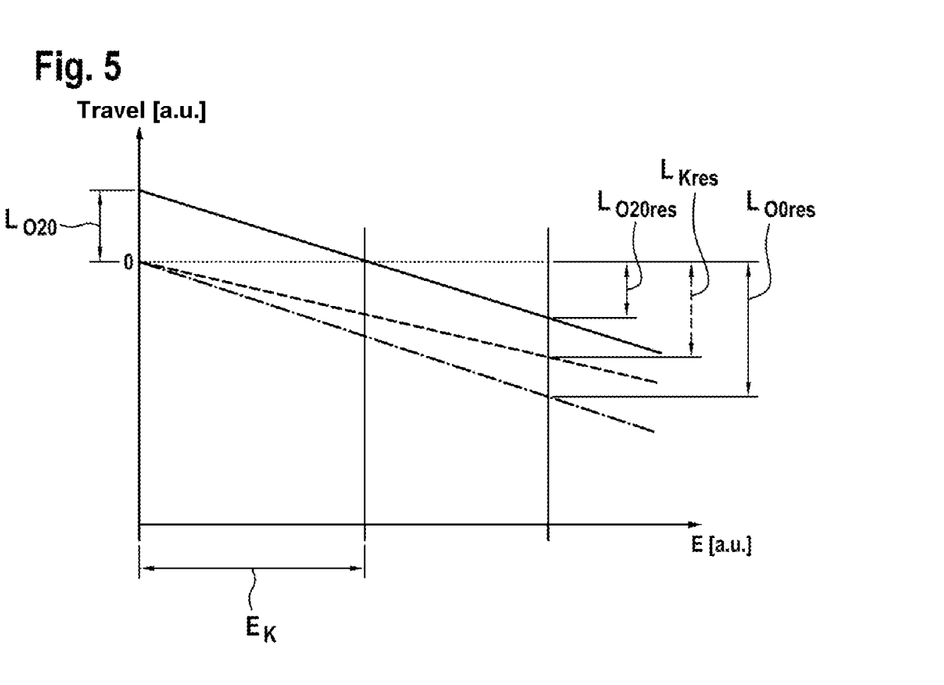
FIG. 5 shows a diagram for illustrating an action of a compensation element.

FIG. 5 shows a diagram for illustrating the mode of action of the compensation element, in which the travels of an actuator with and without a compensation element at different temperatures are plotted over the value E of the electric field strength. Here, the dot-dashed line represents the travel of an actuator without a compensation element at a temperature X, for example 22° Celsius. The dashed line represents the travel of an actuator with a compensation element, which is designed such that it has a thermal expansion of 0, with the result that the travel applies for the temperature X and the temperature Y, which is about 20 Kelvin higher. The solid line represents the travel of the actuator without a compensation element at the temperature Y. At the temperature X, the resultant travel $L_{O0res}$ of the actuator without a compensation element is greater than the resultant travel $L_{Kres}$ of the actuator with a compensation element, this being attributable to the stiffness of the compensation element, which has to be deformed by the actuator. If the resultant travels are considered at a temperature Y that is 20 Kelvin higher than the temperature X, the travel $L_{O0res}$ of the actuator without a compensation element is already not equal to zero without an applied electric field. An electric field strength $E_k$ is already involved in order to compensate the change in length brought about by the change in temperature. As a result, the resultant travel $L_{O20res}$ is reduced at a maximum available electric field to a value which is lower than the resultant travel $L_{Kres}$, which remains constant, of the actuator with a compensation element. The travel available for correcting imaging aberrations is therefore greater for the actuator with a compensation element than for the one without a compensation element.

Figure 6A:
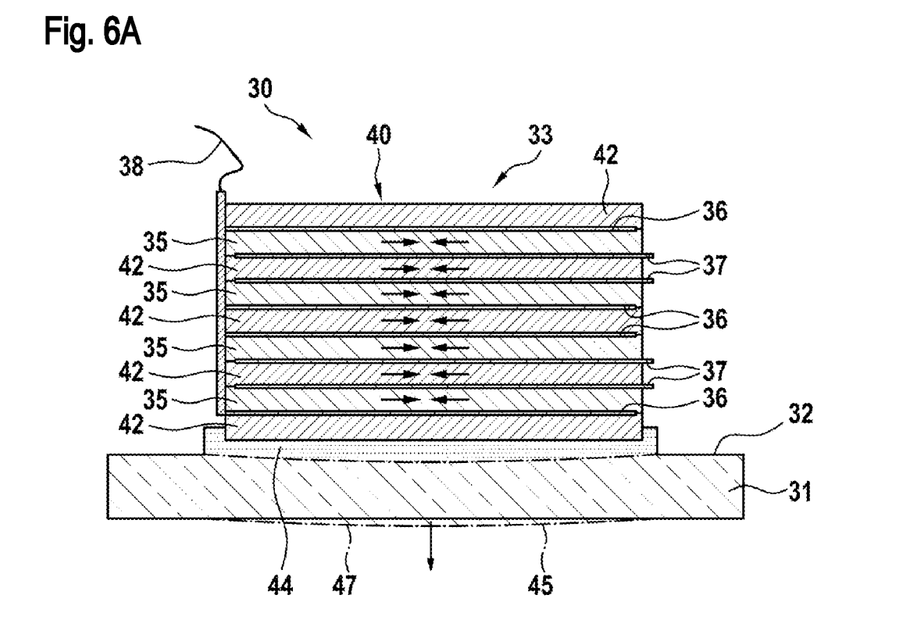
FIGS. 6A-6B show a schematic illustration of possible electrode arrangements of actuators.
Figure 6B:
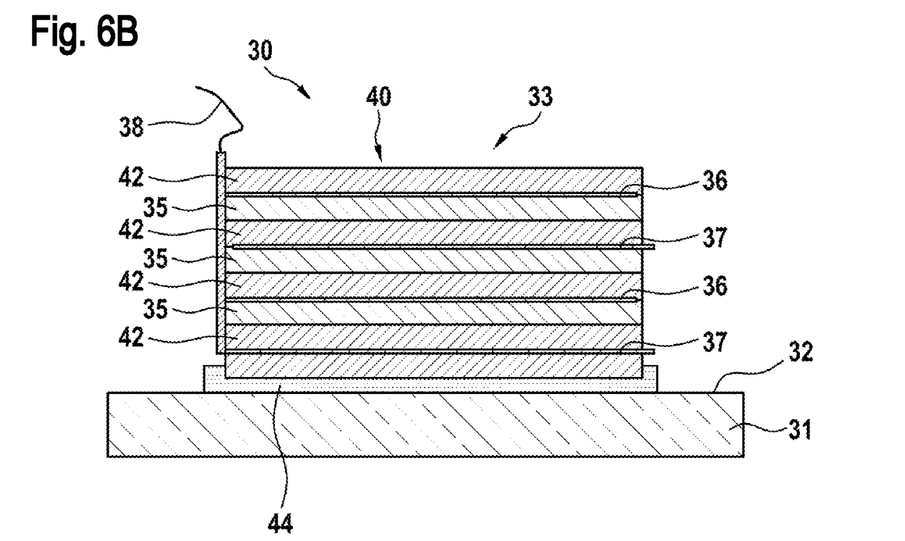

FIGS. 6A and 6B show two different arrangements of electrodes 36, 37, in each of which an optical assembly 30 having an actuator 33 with a layered construction made up of electrostrictive layers 35 and compensation layers 42 is illustrated.

In FIG. 6A, the voltage electrodes 36 and neutral electrodes 37 are arranged between the alternating electrostrictive layers 35 of the actuator 33 and the compensation layers 42 of the compensation element 40 such that the compensation layer 42 is enclosed either by two voltage electrodes 36 or two neutral electrodes 37. This has the result that, in the compensation layers 42, no electric field is applied and, as a result, no reaction is brought about on account of an electric field in the compensation layers 42. The actuator 33 is connected to the rear side 32 of the mirror 31 via an adhesive layer 44 made from an adhesive exhibiting shear stiffness. If an electric field is applied in the electrostrictive layers 35 via the electrodes 36, 37, the actuator 33 expands perpendicularly to the layers 35, 42 and contracts on account of the transverse contraction in the direction of the layer planes. As a result, the rear side 32 of the mirror contracts via the adhesive layer 44, causing the formation of a bulge 47 on the optically active mirror top side 45. The effective direction of the actuator, which is illustrated as an arrow in FIG. 6A, is thus perpendicular to the transverse contraction of the actuator 33. The voltage electrodes 36 are connected via an attachment 38 to an open-loop and/or closed-loop controller (not illustrated). The neutral electrodes 37 are connected to the ground wire (not illustrated). The compensation layers 42 are arranged such that they form the capping layer for the actuator 33, i.e. protect the electrodes 36, 37 from mechanical contact. As a result, it is possible to dispense with the usually capping layers in the construction of the actuator 33.

FIG. 6B shows an arrangement of the voltage electrodes 36 and neutral electrodes 37, which are arranged such that an electric field is also applied in the compensation layers 42. This results in a greater spacing between the electrodes 36, 37 and thus, via a weaker electric field, in lower sensitivity of the actuator. A reaction of the compensation layers 42 on account of the electric field is, if present, taken into consideration when controlling the actuator 33. The voltage electrodes 36 are, as in FIG. 6A, likewise attached via an attachment 38 to an open-loop and/or closed-loop controller (not illustrated). The electrostrictive layers 35 may comprise for example lead magnesium niobate ceramics (PMN) and the compensation layers 42 may comprise for example barium strontium zinc silicon oxide. The actuator 33 is likewise, as already described with reference to FIG. 6A, connected to the rear side 32 of the mirror 31 by an adhesive layer 44 exhibiting shear stiffness, wherein the illustration in FIG. 6B shows a non-deflected optical assembly 30.

FIGS. 7A to 7D each show a diagram for illustrating the effect of the change in temperature on the compensation element and the sensitivity of the electrostrictive effect.

Figure 7A:
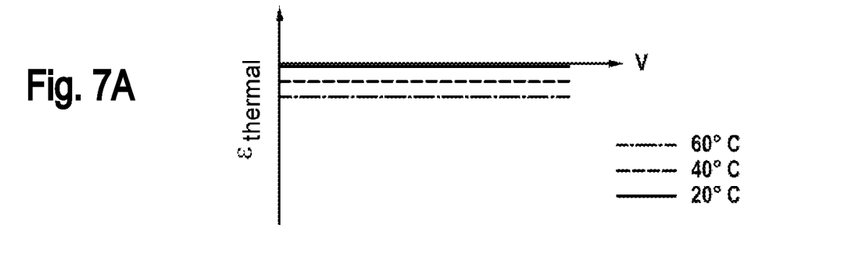
FIGS. 7A-7D show a diagram for illustrating an effect of a change in temperature on the compensation element and the sensitivity of the electrostrictive effect.

FIG. 7A shows the change in shape of the actuator with a compensation element at a temperature of 20° Celsius, 40° Celsius and 60° Celsius. The change in shape $\varepsilon_{thermal}$ of the actuator with the compensation element is independent of the voltage and negative on account of the negative thermal expansion of the compensation element. In other words, FIG. 7A shows the voltage-independent contribution of the coefficient of thermal expansion, which is negative in the example shown. The thermal change in shape $\varepsilon_{thermal}$ is plotted in arbitrary units over the voltage. Note that FIG. 7A does not illustrate the coefficient of linear thermal expansion but rather a real thermally induced contraction of compensation layers of an actuator with increasing temperature independently of a voltage applied to the actuator.

Figure 7B:
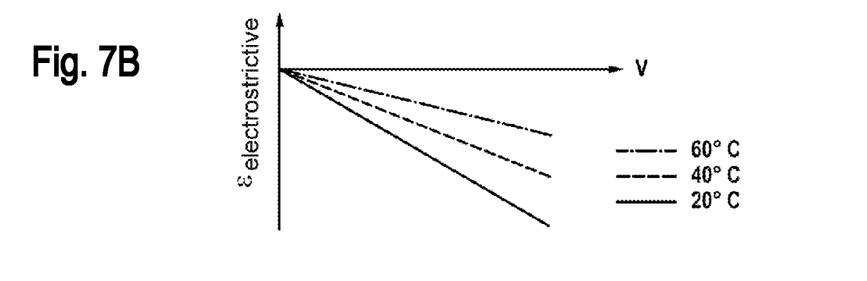

FIG. 7B shows the electrostrictive extension or deformation of the actuator over the applied voltage at a temperature of 20° Celsius, 40° Celsius and 60° Celsius. The gradient of the curves decreases with increasing temperature, and so the change in shape per voltage unit is, at a constant voltage (at a constant spacing d of the electrodes), different for different temperatures. Since, in the exemplary embodiment described, the transverse contraction of the actuator is used with longitudinal expansion as manipulated variable, the change in shape with increasing voltage is likewise negative. Only the electrostrictive portion is shown in FIG. 7B—for this reason, the straight lines that represent this portion all start at the same position on the y-axis, this not being the case in reality.

Figure 7C:
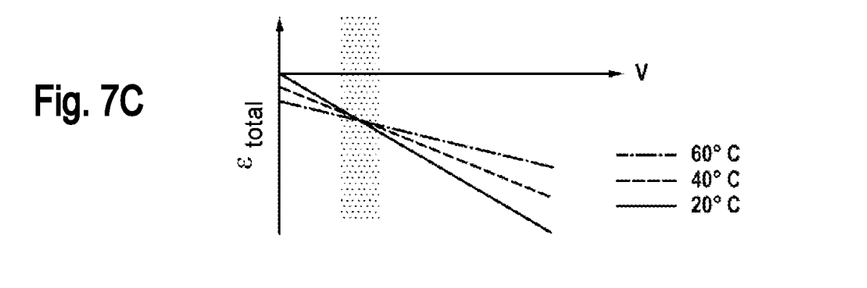
Figure 7D:
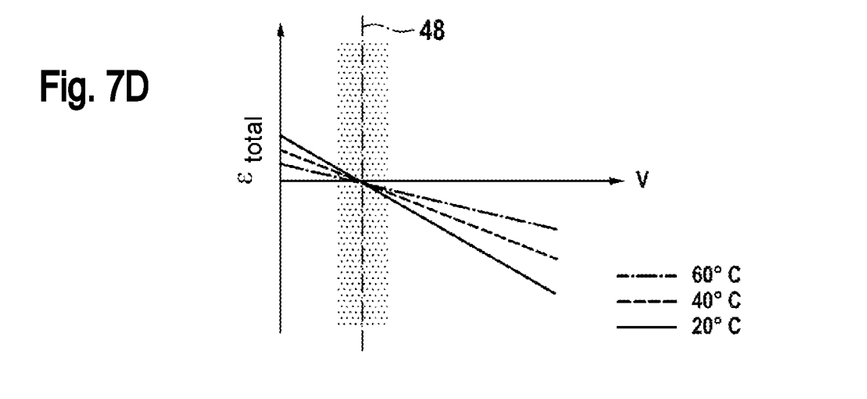

FIG. 7D shows only the situation in which the actuator is operated with a bias voltage in its zero position, and for this reason the x-axis has been shifted accordingly. (Note: possibly adapting the illustration here may be misleading. Possibly even omit FIG. 7D and just verbally discuss FIG. 7C).

FIG. 7C now shows the total change in shape of the actuator by the thermal and the electrostrictive effect at a temperature of 20° Celsius, 40° Celsius and 60° Celsius. Note that the effects compensate one another at a particular voltage, meaning that the curves for different temperatures intersect. Thus, FIG. 7C shows the real relationships as a superimposition of both effects. Depending on the temperature, the actuator starts at a voltage of 0 V in different expansion states, as is apparent from the y-axis portions in FIG. 7C. On account of the different electrostrictive expansions at different temperatures, there is, however, a voltage region, indicated in a lightly shaded manner in the figure, in which the three curves shown intersect. In this voltage region, the deformation of the actuator is more or less independent of the ambient temperature. However, the different sensitivity of the actuator to voltage changes at different temperatures is still to be noted, as is immediately clear from the different gradients of the individual straight lines. As a result, the actuator thus displays, given a suitable choice of the bias voltage, a largely minimized temperature drift.

FIG. 7D now shows the change in shape of the actuator for different temperatures, as finds application jointly with the optical element. The actuator is mounted under a bias voltage in the neutral position of the optical element in the form of a mirror, that is to say the position in which the surface of the mirror corresponds to its target shape. If the bias voltage is reduced to zero, the actuator expands and the mirror surface deforms. If the projection exposure apparatus is now put into operation, the actuator is controlled with the determined bias voltage and the surface corresponds to its target shape, independently of the temperature of the mirror. The application of the bias voltage is reflected in the figure in that a new zero point of the y-axis—namely the desired actuator deformation is set at the target shape of the surface. The adaptation of the shape of the mirror surface can now be set more or less independently of the temperature via the voltage applied to the actuator. Only the temperature-dependent sensitivity of the electrostrictive effect is, in general, taken into consideration, as already mentioned above, in dependence on the desired properties in terms of precision of the shape of the mirror surface.

LIST OF REFERENCE SIGNS

1 Projection exposure apparatus
2 Field facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate field focal plane
16 Pupil facet mirror
17 Assembly
18 Mirror
19 Mirror
20 Mirror
30 Optical assembly
31 Mirror
32 Rear side of the mirror
33 Actuator
34 Actuator layer 35 Electrostrictive layer
36 Voltage electrode
37 Neutral electrode
38 Voltage electrode attachment
39 Electrostrictive material
40 Compensation element
41 Compensation plate
42 Compensation layer
43 Compensation bead
44 Adhesive layer
45 Mirror top side
46 Actuator matrix
47 Bulge
48 Bias voltage
L Change in length
Q Transverse contraction
$L_{Kres}$ Resultant change in length at maximum electric field with compensation element
$L_{O0res}$ Resultant change in length at maximum electric field without compensation element at $\Delta T=0K$
$L_{O20}$ Change in length without compensation element at $\Delta T=20K$
$L_{O20res}$ Resultant change in length at maximum electric field without compensation element at $\Delta T=20K$
$E_K$ Electric field strength for compensation of the change in length
$\varepsilon_{thermal}$ Extension/change in length on account of change in temperature
$\varepsilon_{electrostrictive}$ Extension/change in length on account of electrostrictive effect
$\varepsilon_{total}$ Total extension/change in length (temperature and electrostrictive effect)
V Voltage

What is claimed is:

1. An optical assembly, comprising:
an optical element;
an actuator configured to deform the optical element; and
a compensation element,
wherein:
the actuator is configured so that, when the actuator is in a zero position and the actuator is subjected to a bias voltage, the actuator deflects;
the bias voltage is such that a change in shape of the actuator due to a change in temperature is compensated by a reduction in a sensitivity of the actuator due to the change in temperature;
the compensation element is configured to compensate a change in geometry due to the change in temperature of the actuator; and
a thermal expansion of the compensation element is different from a thermal expansion of the actuator.

2. The optical assembly of claim 1, wherein a sign of the thermal expansion of the compensation element is opposite to a sign of the thermal expansion of the actuator.

3. The optical assembly of claim 1, wherein the thermal expansion of the compensation element is negative.

4. The optical assembly of claim 1, wherein the compensation element is between the optical element and the actuator.

5. The optical assembly of claim 1, wherein the actuator comprises the compensation element.

6. The optical assembly of claim 1, wherein the actuator comprises layers comprising an electrostrictive material, and the layers alternate with layers comprising the compensation element.

7. The optical assembly of claim 1, wherein the compensation element comprises a plurality of layers.

8. The optical assembly of claim 7, further comprising electrodes are between the layers.

9. The optical assembly of claim 8, wherein the electrodes are configured so that no electric field forms across the layers of the compensation element during use of the optical assembly.

10. The optical assembly of claim 9, wherein the actuator is configured so that the compensation element is embedded in the form of a plurality of individual elements in the material of the actuator.

11. The optical assembly of claim 1, wherein the actuator and the compensation element are formed together so that at least one of the following holds:
when the temperature changes in an effective direction of the actuator, a difference in geometry is less than 5 ppm/K from a target value;
when there is a change in temperature, an expansion corresponding to the change in geometry of a component part connected to the actuator and/or to the compensation element arises; and
the actuator and the compensation element compensate an expansion of a component part connected to the actuator and/or to the compensation element.

12. The optical assembly of claim 1, wherein the actuator is configured so that, when the actuator undergoes a transverse deformation, the optical element is deformed.

13. The optical assembly of claim 1, wherein the actuator comprises at least one member selected from the group consisting of electrostrictive elements, piezoelectric elements, and magnetostrictive elements.

14. The optical assembly of claim 1, wherein:
the actuator comprises layers;
the compensation element comprises layers; and
for each of at least some of the layers of the compensation element, the layer of the compensation element is between layers of the actuator.

15. The optical assembly of claim 1, wherein the optical element comprises a mirror.

16. The optical assembly of claim 1, wherein the optical assembly comprises a plurality of individual actuators.

17. An apparatus, comprising:
the optical assembly of claim 1,
wherein the apparatus is a projection exposure apparatus for semiconductor lithography.

18. The optical assembly of claim 1, wherein:
the compensation element comprises a plurality of layers;
the actuator comprises a plurality of layers; and
the layers of the compensation element and the layers of the actuator define a stack of concentrically disposed layers in which the layers of the compensation element and the layers of the actuator alternate.

19. The optical assembly of claim 1, wherein the actuator comprises beads disposed within the actuator.

20. A method, comprising
applying a non-zero bias voltage to an actuator so that the actuator is in its zero position,
wherein the actuator is configured to deform an optical element of a projection exposure apparatus for semiconductor lithography,
wherein:
changing a temperature of the actuator changes a sensitivity of the actuator and changes a shape of the actuator; and
the method further comprises selecting the non-zero bias voltage such that the change in the sensitivity of the actuator due to the change in temperature of the actuator is utilized to compensate for the change in the shape of the actuator due to the change in temperature.

21. The optical assembly of claim 1, wherein the optical element, the compensation element and the actuator define a stack in which the compensation element is between the optical element and the actuator.

22. The optical assembly of claim 1, wherein:
the compensation element comprises a plurality of layers;
the actuator comprises a plurality of layers; and
the layers of the compensation element and the layers of the actuator define a stack of layers in which the layers of the compensation element alternate with the layers of the actuator.

23. The optical assembly of claim 22, further comprising voltage electrodes and neutral electrodes, wherein:
each voltage electrode is between an adjacent layer of the actuator and an adjacent layer of the compensation element;
each neutral electrode is between an adjacent layer of the actuator and an adjacent layer of the compensation element; and
the voltage electrodes and neutral electrodes are configured to apply an electric field to the layers of the compensation element.

* * * * *

UNITED STATES PATENT AND TRADEMARK OFFICE
CERTIFICATE OF CORRECTION

PATENT NO. : 12,313,978 B2
APPLICATION NO. : 17/818904
DATED : May 27, 2025
INVENTOR(S) : Andreas Raba, Johannes Lippert and Markus Raab It is certified that error appears in the above-identified patent and that said Letters Patent is hereby corrected as shown below:

In the Specification

Column 1, Line 67, delete "no be" and insert -- be no --.

Column 6, Line 56, after "plurality" insert -- of --.

Column 8, Line 30, delete "$L_{O0res}$" and insert -- $L_{O20}$ --.

Signed and Sealed this
Fifteenth Day of July, 2025

Coke Morgan Stewart
*Acting Director of the United States Patent and Trademark Office*